(12) United States Patent
Kuo

(10) Patent No.: US 7,411,782 B2
(45) Date of Patent: Aug. 12, 2008

(54) COMPUTER

(75) Inventor: Szu-Wei Kuo, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 7 days.

(21) Appl. No.: 11/309,871

(22) Filed: Oct. 16, 2006

(65) Prior Publication Data

US 2007/0215947 A1 Sep. 20, 2007

(30) Foreign Application Priority Data

Mar. 15, 2006 (CN) .................... 2006 2 0056547 U

(51) Int. Cl.
*G06F 1/16* (2006.01)
(52) U.S. Cl. .................. 361/683; 345/163; 235/454; 369/47.1
(58) Field of Classification Search ............... 257/355; 345/501, 559, 163; 235/472.01, 454; 353/119; 369/47.1, 53.1; 361/679–687, 724–727
See application file for complete search history.

(56) References Cited

U.S. PATENT DOCUMENTS

| | | | |
|---|---|---|---|
| 5,803,569 A * | 9/1998 | Ma | 353/120 |
| 6,519,146 B2 | 2/2003 | Nagashima et al. | |
| 7,251,125 B2 * | 7/2007 | Heckerman | 361/681 |
| 2006/0028793 A1 * | 2/2006 | Na et al. | 361/683 |

* cited by examiner

*Primary Examiner*—Hung V Duong
(74) *Attorney, Agent, or Firm*—Wei Te Chung

(57) ABSTRACT

An exemplary computer includes a host machine, and a display device. The host machine defines a recessed portion in a side panel thereof to receive the display device therein. The display device includes a frame, and an LCD panel installed in the frame. The recessed portion includes a pair of elongated grooves defined in one pair of sidewalls thereof, and a plurality of vents defined in a base wall thereof. The frame includes a pair of posts extending from side portions thereof to engage in the elongated grooves. The posts are surrounded with resilient materials and tightly received in the elongated grooves in an interferential fit. The display device is pivotable about more than one axis relative to the host machine.

20 Claims, 4 Drawing Sheets

COMPUTER

FIELD OF THE INVENTION

The present invention relates to computers, and particularly relates to desktop type computers integrated or combined with a liquid crystal display (LCD).

DESCRIPTION OF RELATED ART

Personal computer systems are, by now, well known in the art and have been supplied in a number of different configurations, including desktop systems with CPU housings separate from monitors, notebook systems, and unitary systems. A conventional personal computer includes multiple components (main computer case, keyboard, monitor, speakers, etc.,). Traditionally, these components were typically separate from one another, the separate components being connected by electronic cables. There have been efforts to integrate the components of computers, and to make the computers as compact as possible. For example, systems have been developed wherein multiple computer components (e.g., motherboard, hard drives, removable media drives, speakers, etc.) have been integrated with a display component (e.g., flat panel display, cathode ray tube, etc.) to form an integrated computer system. In one example of an integrated desktop computer, the computer components are mounted within the same housing that houses the display. It is inconvenient to upgrade and repair such an integrated computer with so many components filling the display housing limiting the space therein. Furthermore, it is difficult to adequately dissipate heat produced from such a computer.

What is needed is to provide an integrated computer which has a structure for convenient use and good heat dissipation.

SUMMARY OF THE INVENTION

An exemplary computer includes a host machine, and a display device. The host machine defines a recessed portion in a side panel thereof to receive the display device therein. The display device includes a frame, and an LCD panel installed in the frame. The recessed portion includes a pair of elongated grooves defined in one pair of sidewalls thereof, and a plurality of vents defined in a base wall thereof. The frame includes a pair of posts extending from side portions thereof to engage in the elongated grooves. The posts are surrounded with resilient materials and tightly received in the elongated groove in an interferential fit. The display device is pivotable about more than one axis relative to the host machine.

Other advantages and novel features of the invention will become more apparent from the following detailed description when taken in conjunction with the accompanying drawings, in which:

DETAILED DESCRIPTION OF THE INVENTION

Figure 1:
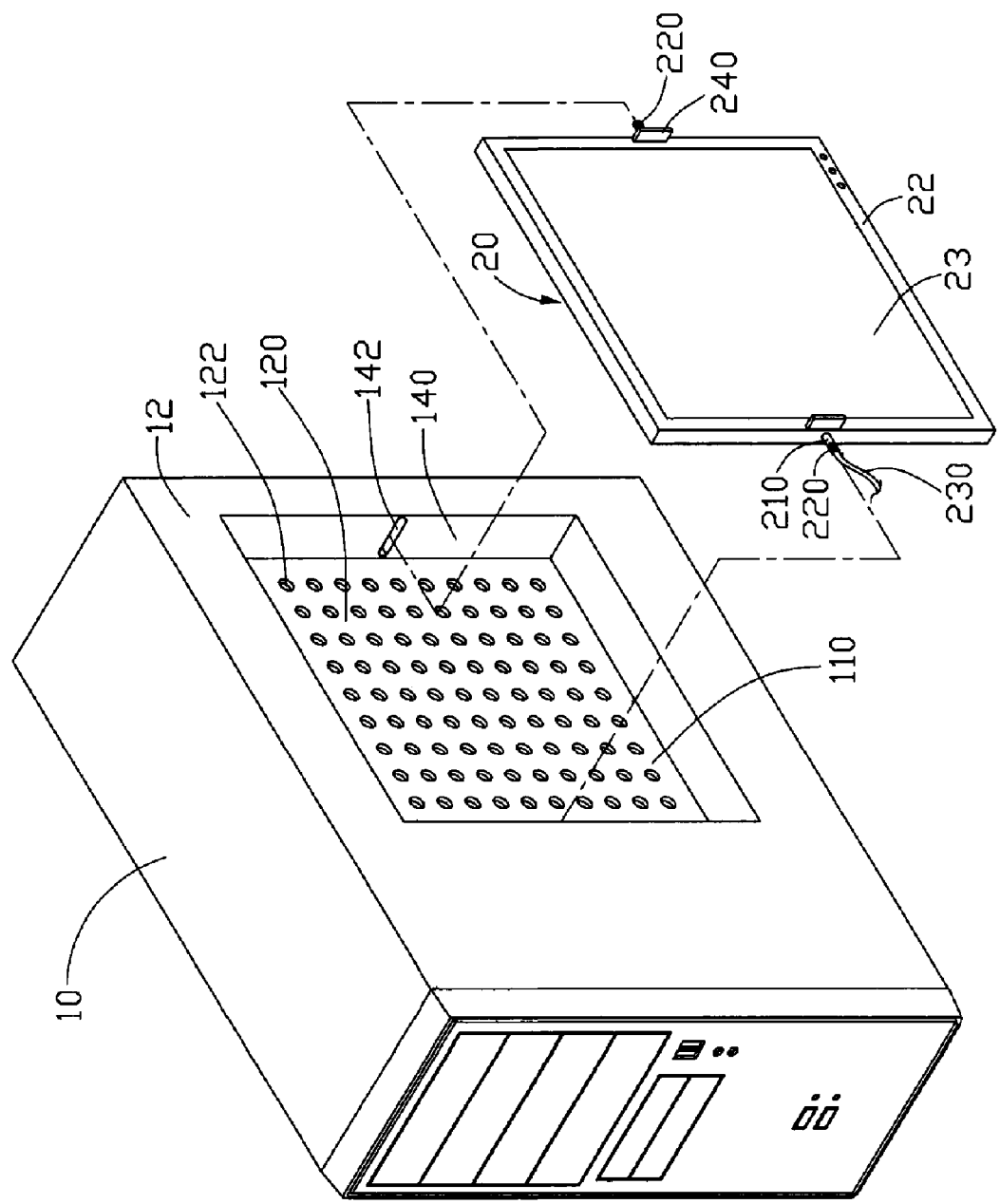
FIG. 1 is an exploded, isometric view of a computer in accordance with a preferred embodiment of the present invention, the computer includes a host machine, and a display device.
Figure 2:
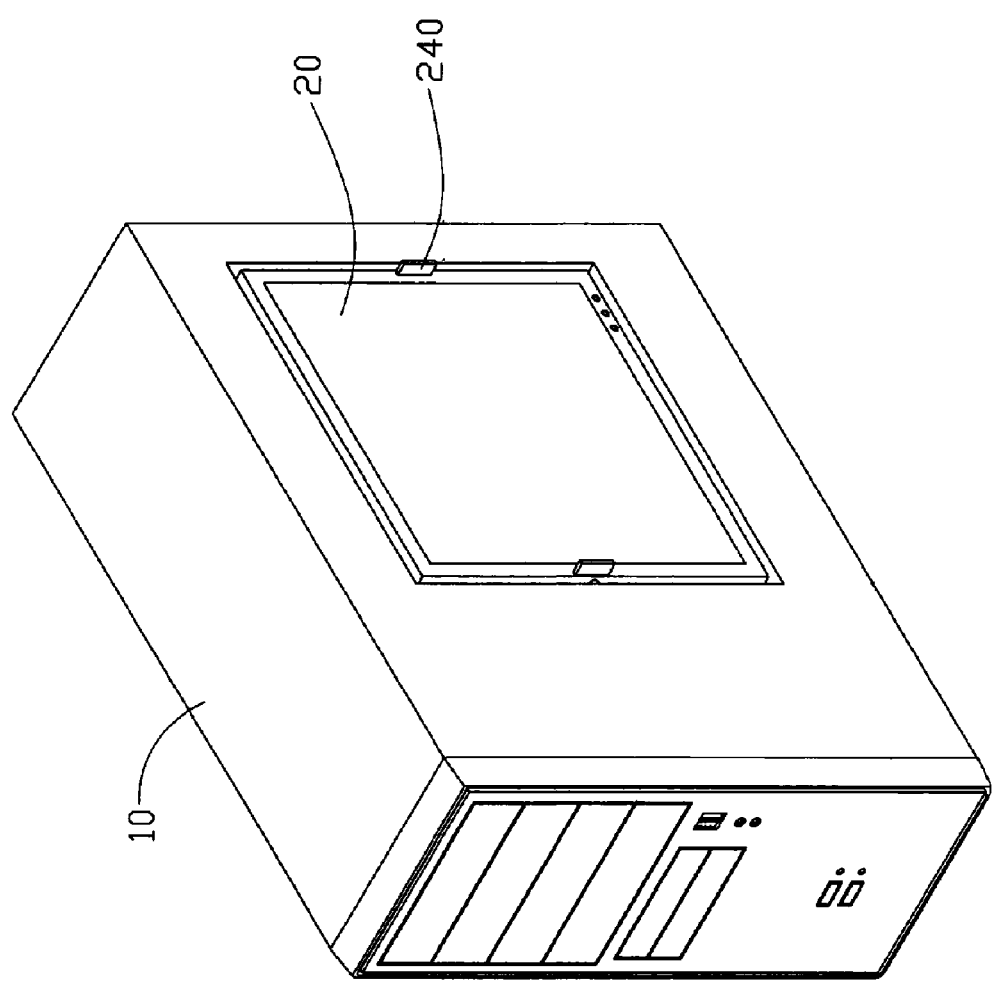
FIGS. 2 to 4 are assembled views of FIG. 1, respectively showing the display in different states.

Referring to FIGS. 1 to 2, a computer in accordance with a preferred embodiment of the present invention includes a host machine 10, and a display device 20 movably attached to the host machine 10.

The host machine 10 has conventional configurations and is equipped with traditional components, such as motherboards, hard disks, power supplies, optical drives, and so on. The host machine 10 includes a side panel 12. A recessed portion 110 is defined in the side panel 12. The recessed portion 110 includes a base wall 120, and a plurality of sidewalls 140 perpendicularly formed around the base wall 120, cooperatively defining a space to receive the display device 20 therein. A plurality of vents 122 is defined in the base wall 120 of the recessed portion 110. A pair of elongated grooves 142 is symmetrically defined in one pair of vertical sidewalls 140 of the recessed portion 110 respectively.

The display device 20 includes a frame 22, and a liquid crystal display (LCD) panel 23 installed in the frame 22. A pair of posts 210 extends perpendicularly from middles of vertical side portions of the frame 22, corresponding to the elongated grooves 142 of the host machine 10. Each of the posts 210 is surrounded with some resilient materials, such as rubber. Each of the posts 210 includes a threaded portion formed at a distal portion thereof. A pair of tabs 240 extends perpendicularly from outside surface portions of the frame 22 beside the posts 210, for manual operations. In this preferred embodiment, a through hole is defined in the left post 210. Power lines and signal lines of the LCD panel 23 are integrated into cables. The cables extend through the through hole of the left post 210 to communicate with relating components of the host machine 10.

In assembly, the display device 20 is movably located in the recessed portion 110 of the host machine 10, with the posts 210 extending through the elongated grooves 142, and screws after extending through the elongated grooves 142 engage with the threaded portions 220 of the posts 210. On one hand, the posts 210 are tightly held in the elongated grooves 142 to position the display device 20. On the other hand, resilient materials surrounding the posts 210 are deformable so that the posts 210 may slide and pivot in the elongated grooves 142 to selectively position the display device 20.

Figure 3:
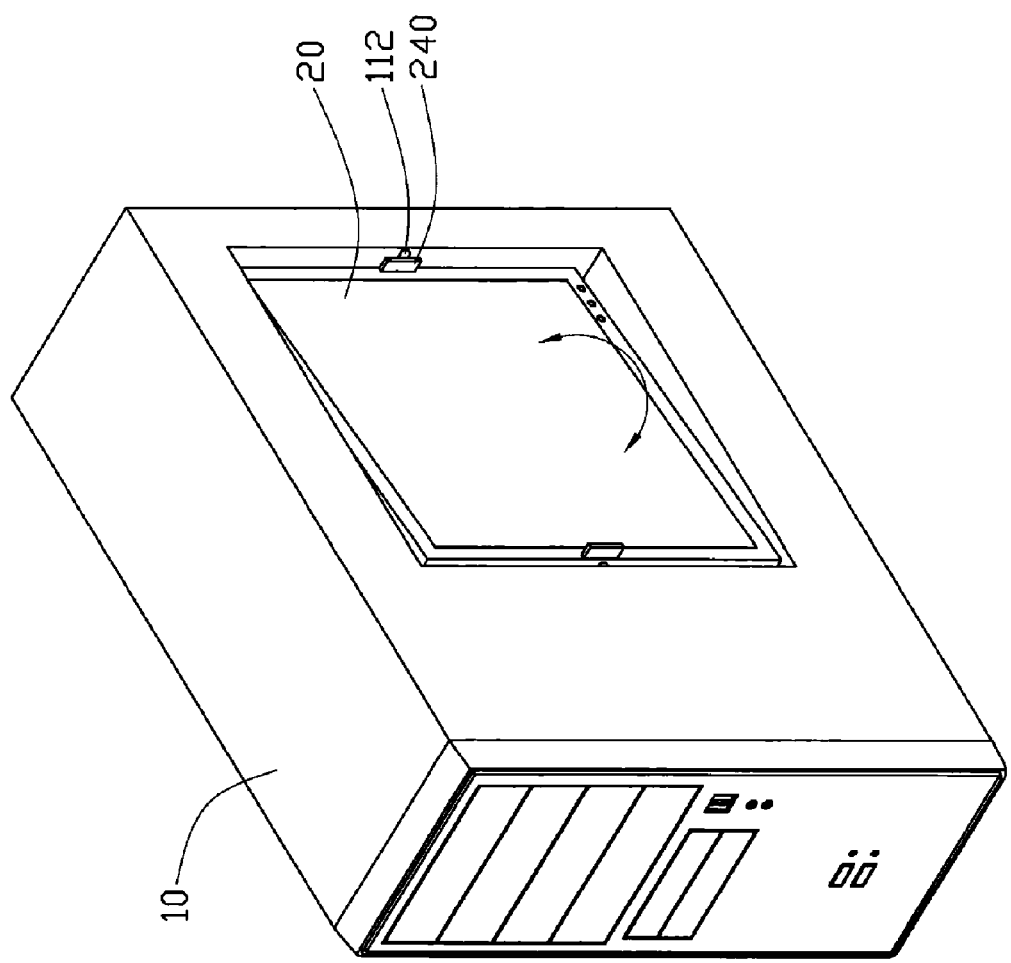
Figure 4:
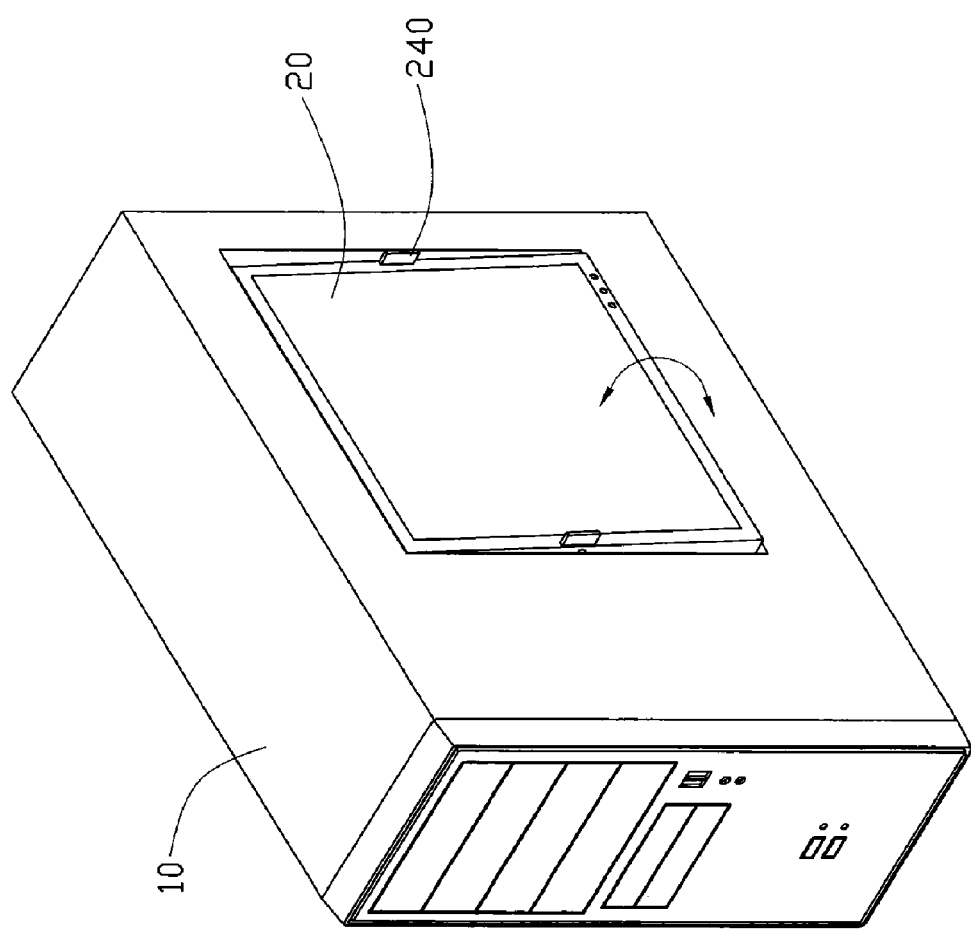

When one of the tabs 240 is pushed and the other one of the tabs 240 is drawn, one of the posts 210 slides inward in the elongated grooves 142, while the other one of the posts 210 slides outward in the elongated grooves 142, which result in the display device 20 pivoting slightly about a vertical axis, as shown in FIG. 3 as a double arrow path thereof. When the tabs 240 are drawn outward or pushed inward at the same time, the posts 210 slightly pivot in the elongated grooves 142 about a horizontal axis, which result in the display device 20 pivoting slightly about the horizontal axis, as shown in FIG. 4 as a double path thereof. Friction between the elongated grooves 142 and the resilient materials surrounding the posts 210, keep the display device 20 located in a certain position until outside force is applied thereto. Heat produced by the LCD panel 23 easily transfers to the host machine 10 to be dissipated via the vents 122 of the host machine 10.

Alternatively, the elongated grooves 142 can be defined in one pair of horizontal sidewalls 140 of the recessed portion 110 of the host machine 10. The posts 210 can extend perpendicularly from horizontal edge portions of the frame 22 of the display device 20. Tabs 240 can extend from horizontal edge portions of the frame 22.

Further, an additional pair of elongated grooves can be defined in the pair of horizontal sidewalls 140 of the side panel 12 of the host machine 10. An additional pair of posts can extend from horizontal side portions of the frame 22, to engage in the corresponding elongated grooves of the host machine 10. An additional pair of tabs can extend from horizontal side portions of the frame 22, for manual operations.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A computer comprising:
   a computer host machine comprising a recessed portion defined therein, the recessed portion comprising a pair of sidewalls, a pair of elongated grooves defined in the sidewalls respectively; and
   a display device received in the recessed portion, the display device comprising a pair of posts extending therefrom to engage in the elongated grooves of the host machine which allows the display device to be moved to variable positions relative to the host machine.

2. The computer as claimed in claim 1, wherein the recessed portion further comprises a base wall perpendicularly disposed between the sidewalls, a plurality of vents is defined in the base wall.

3. The computer as claimed in claim 1, wherein the posts are surrounded with resilient materials compressed between the posts and edges of the grooves so that the display device is capable of being kept at variable positions.

4. The computer enclosure as claimed in claim 1, wherein a threaded portion is formed at a distal end of each of the posts, for engaging with a screw after extending through the groove.

5. The computer as claimed in claim 1, wherein the display device comprises a frame, and a liquid crystal display panel installed therein, the posts extend from opposite sides of the frame.

6. The computer as claimed in claim 1, wherein a pair of tabs extends from the frame adjacent the posts.

7. The computer as claimed in claim 6, wherein when one of the tabs is pushed and the other one of the tabs is drawn, the posts pivot in the elongated grooves so that the display device pivots about a first axis.

8. The computer as claimed in claim 7, wherein when the tabs are drawn outward or pushed inward at the same time, the posts slightly pivot in the elongated grooves outward or inward so that the display device pivots about a second axis generally perpendicular to the first axis.

9. A computer comprising:
   a host machine comprising a recessed portion defined therein, the recessed portion includes a plurality of walls, at least one wall defining a plurality of vents therein; and
   a display device received in the recessed portion and comprising a liquid crystal display panel installed therein, the display device being pivotably in the recessed portion about two axes respectively.

10. The computer as claimed in claim 9, wherein the recessed portion is defined in a side panel of the host machine, the recessed portion comprises a base wall, and a plurality of sidewalls perpendicular to the base wall, the vents are defined in the base wall.

11. The computer as claimed in claim 10, wherein a pair of elongated grooves is defined in at least one pair of the sidewalls of the recessed portion, the display device further comprises a frame to hold the liquid crystal display panel, at least one pair of posts extends from opposite sides of the frame to engage in the elongated grooves.

12. The computer as claimed in claim 10, wherein the posts are surrounded with resilient materials compressed between the posts and edges of the grooves so that the display device is capable of being kept at variable positions.

13. The computer as claimed in claim 10, wherein a threaded portion is formed in a distal of each of the posts, for engaging with a screw after extending through the groove.

14. The computer as claimed in claim 11, wherein at least one pair of tabs extends from the frame adjacent said at least one pair of posts, when one of said at least one pair of tabs is pushed and the other one of said at least one pair of tabs is drawn, said at least one pair of posts slide in said at least one pair of elongated grooves so that the display device pivots about a first axis.

15. The computer as claimed in claim 14, wherein when said at least one pair of tabs are drawn outward or pushed inward at the same time, said at least one pair of posts slightly pivot in said at least one pair of elongated grooves so that the display device pivots about a second axis generally perpendicular to the first axis.

16. A computer comprising:
   a host machine comprising a plurality of panels cooperatively defining a housing configured for receiving a motherboard and a power supply therein, a recessed portion being defined in an outer face of one of the panels; and
   a flat display device received in the recessed portion and electrically connecting with the motherboard and the power supply, the display device being pivotable to variable positions in the recessed portion under a force exerted thereon and being kept in the variable positions when the force withdrawn.

17. The computer as claimed in claim 16, wherein the host machine is parallelepiped-shaped.

18. The computer as claimed in claim 16, wherein the display device is pivotable about two axes perpendicular to each other.

19. The computer as claimed in claim 16, wherein the recessed portion comprises a base wall parallel to and offsetting from said one of the panels, and a plurality of side walls connecting the base wall and said one of the panels, the base wall defining a plurality of heat dissipating vents facing the display device.

20. The computer as claimed in claim 19, wherein the display device is mounted to the side walls via posts slidably and pivotably received in elongated grooves, and the posts are surrounded by resilient materials respectively sandwiched between the posts and edges of the grooves which allows the display device to be kept in the variable position.

* * * * *